United States Patent
Prest et al.

(10) Patent No.: US 8,346,183 B2
(45) Date of Patent: Jan. 1, 2013

(54) SEAMLESS INSERT MOLDING TECHNIQUES

(75) Inventors: Christopher Prest, San Francisco, CA (US); Erik Wang, Redwood City, CA (US); Bradley Hamel, Sunnyvale, CA (US); Phillip Michael Hobson, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 902 days.

(21) Appl. No.: 12/194,471

(22) Filed: Aug. 19, 2008

(65) Prior Publication Data
US 2010/0048257 A1   Feb. 25, 2010

(51) Int. Cl.
*H04M 1/00* (2006.01)
*G06F 1/16* (2006.01)

(52) U.S. Cl. ............... 455/90.3; 455/347; 455/575.1; 361/679.3; 361/679.55; 361/679.56; 428/34.1; 428/34.3; 428/34.4

(58) Field of Classification Search .......... 361/679.3
See application file for complete search history.

(56) References Cited

U.S. PATENT DOCUMENTS

| | | | | |
|---|---|---|---|---|
| 5,925,847 A * | 7/1999 | Rademacher et al. | ......... | 174/372 |
| 6,627,814 B1 * | 9/2003 | Stark | ............... | 174/539 |
| 6,771,490 B2 * | 8/2004 | Peker et al. | ............. | 361/679.34 |
| 6,996,425 B2 * | 2/2006 | Watanabe | .................. | 455/575.1 |
| 7,195,862 B2 * | 3/2007 | Gmur et al. | .................... | 430/320 |
| 7,224,945 B2 * | 5/2007 | Gartrell | ......................... | 455/90.3 |
| 7,440,285 B2 * | 10/2008 | Centofante | ................... | 361/737 |
| 7,563,990 B2 * | 7/2009 | Leurs et al. | ................... | 174/521 |
| 7,651,781 B2 * | 1/2010 | Richards et al. | ............ | 428/542.8 |
| 7,684,178 B2 * | 3/2010 | Hsu et al. | ................. | 361/679.21 |
| 7,756,553 B2 * | 7/2010 | Dinh et al. | ................. | 455/575.1 |
| 7,797,818 B2 * | 9/2010 | Saboune | ......................... | 29/718 |
| 7,821,782 B2 * | 10/2010 | Doherty et al. | .......... | 361/679.26 |
| 7,900,338 B2 * | 3/2011 | Straub et al. | .................... | 29/594 |
| 7,937,127 B1 * | 5/2011 | Satoh et al. | ............... | 455/575.7 |
| 8,086,291 B2 * | 12/2011 | Maenpaa et al. | ........... | 455/575.8 |
| 2002/0162263 A1 * | 11/2002 | Johnson et al. | ................ | 40/793 |
| 2003/0099794 A1 * | 5/2003 | Sasaki et al. | ................ | 428/35.7 |
| 2006/0050475 A1 * | 3/2006 | Chen | ............................ | 361/683 |
| 2006/0163760 A1 * | 7/2006 | Jensen et al. | ................. | 264/1.31 |
| 2008/0019083 A1 * | 1/2008 | Lim et al. | ...................... | 361/679 |
| 2008/0158789 A1 * | 7/2008 | Centofante | .................. | 361/679 |
| 2008/0227507 A1 * | 9/2008 | Joo | ............................ | 455/575.8 |
| 2008/0241455 A1 * | 10/2008 | DiNello et al. | ................. | 428/58 |
| 2008/0286503 A1 * | 11/2008 | Kampf | ........................ | 428/34.1 |
| 2009/0091886 A1 * | 4/2009 | Grunow et al. | .......... | 361/679.56 |
| 2009/0168337 A1 * | 7/2009 | Conti et al. | ............. | 361/679.56 |
| 2010/0014232 A1 * | 1/2010 | Nishimura | ................. | 361/679.3 |
| 2010/0240421 A1 * | 9/2010 | Sekora et al. | .............. | 455/575.1 |

* cited by examiner

*Primary Examiner* — Anthony Q Edwards
(74) *Attorney, Agent, or Firm* — Womble Carlyle Sandridge & Rice LLP

(57) ABSTRACT

Methods and apparatus for using an insert molding process to form a tactilely seamless overall part from component parts that are made from different materials are disclosed. According to one aspect of the present invention, a housing includes a first part formed from a first material and a second part formed from a second material that is of a different type than the first material. The first part includes a first external surface and a first bonding surface, and the second part includes a second external surface and a second bonding surface. The second bonding surface can be integrally bonded to the first bonding surface so that the first external surface and the second external surface form a gap-free overall surface.

20 Claims, 6 Drawing Sheets

552 IS INTEGRAL BOND

SEAMLESS INSERT MOLDING TECHNIQUES

BACKGROUND OF THE INVENTION

1. Field of the Invention

The present invention relates to the manufacture of parts and, more particularly, to the formation of a single part that includes a seamless interface between components made of different types of materials.

2. Description of the Related Art

In the manufacture of devices, e.g., cellular phones or digital media devices, housings are typically assembled. A housing, which may form an exterior surface of a device, is often formed by assembling multiple parts together. To ensure that a housing may be assembled from multiple parts that are effectively intended to fit together, the design of the overall housing may be such that gaps and/or offsets between external surfaces of the parts exist. By way of example, an overall housing may be designed such that when the overall housing is assembled, there is a gap and/or an offset between an exterior surface of a first part and an exterior surface of a second part, although the first part is coupled to the second part.

Gaps and/or offsets effectively ensure that parts of an assembly may fit together by accommodating slight deviations in the manufacture of the parts. In other words, because the machining of or formation of parts that are to be assembled together into an overall housing may result in slight differences in the dimensions of the parts, to substantially ensure that the parts will fit together despite the slight differences, the housing may be designed such that an external surface formed by the parts includes a space.

Generally, housings may be formed from different materials. For instance, a housing may include a metal bezel that is assembled to a plastic piece. Alternatively, a housing may include a glass piece that is assembled to a plastic piece. The existence of gaps and/or offsets in the design of the housing allows the parts of different materials to be interfaced together such that slight variations in tolerances, and/or imperfections, do not substantially affect the external surface of the housing that is formed from the parts.

For some devices, the existence of gaps and/or offsets in an external surface may be undesirable. By way of example, if the aesthetic quality of, or the cosmetic appearance of, the device is critical, the existence of gaps and/or offsets in the external surface of the device may be considered to be unattractive and, hence, unacceptable.

Therefore, what is needed is a method and an apparatus that allows gaps and/or offsets designed to accommodate imperfections and/or variations in tolerances to be substantially eliminated from an external surface of a housing.

SUMMARY OF THE INVENTION

The present invention pertains to a method and apparatus for forming a housing from at least two different materials that allows an external surface of the housing to appear substantially seamless. In one embodiment, the present invention pertains to injection molding plastic around a non-plastic part. The present invention may be implemented in numerous ways, including, but not limited to, as a method, system, device, or apparatus. Example embodiments of the present invention are discussed below.

According to one embodiment of the present invention, a housing includes a first part formed from a first material and a second part formed from a second material that is of a different type than the first material. The first part includes a first external surface and a first bonding surface, and the second part includes a second external surface and a second bonding surface. The second bonding surface is integrally bonded to the first bonding surface. The first external surface and the second external surface form a gap-free overall surface. In one embodiment, the second material is a plastic material and the first material is a non-plastic material.

In accordance with another embodiment of the present invention, an apparatus includes at least one electrical component and a housing that is arranged at least partially around the electrical component. The housing includes a first housing portion and a second housing portion. The first housing portion is formed from a first material and includes a first external surface and a first bonding surface, and the second housing portion is formed from a second material and includes a second external surface and a second bonding surface. The second material is a different type of material than the first material. The second bonding surface is integrally bonded to the first bonding surface such that the first external surface and the second external surface form a gap-free overall external surface.

According to yet another embodiment of the present invention, a method of fabricating a housing includes obtaining a first part formed from a first material. The first part includes a first external surface and a first bonding surface. The method also includes directly bonding a second part to the first bonding surface. The second part is formed from a second material that is a different type than the first material. Directly bonding the second part to the first part includes creating an overall gap-free external surface of the housing from the first external surface and a second external surface of the second part.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, in which.

DETAILED DESCRIPTION OF THE INVENTION

Example embodiments of the present invention are discussed below with reference to the various figures. However, those skilled in the art will readily appreciate that the detailed description given herein with respect to these figures is for explanatory purposes, as the invention extends beyond these embodiments.

To enhance the aesthetics or cosmetic appearance of housings associated with electrical devices, the housings may be formed using injection molding processes. Through the use of injection molding processes, different parts of a housing may effectively be directly bonded together such that there are no gaps, i.e., gaps which are arranged to accommodate imperfections associated with the different parts, between the different parts. As injection molding essentially allows a first part to be formed directly onto (or attached directly to) a second part, imperfections associated with the second part are rendered substantially irrelevant.

In one embodiment, an injection molding process may be used to form a housing from at least two different materials. By way of example, a housing comprised of a metal part and plastic may be formed by injection molding the plastic at least partially around the metal part such that the plastic directly bonds to the metal part. The bond that forms between the two different materials is effectively an integral bond. A housing formed from a metal part and a plastic part that are integrally bonded may include a surface, e.g., a surface that is arranged to be an external or exterior surface of the housing, created by bonding the metal part and the plastic part that is smooth and seamless. That is, an overall external surface of the housing which includes a surface of the metal part and a surface of the plastic part is substantially gap-free, as the metal part and the plastic part are directly joined.

Figure 1A:
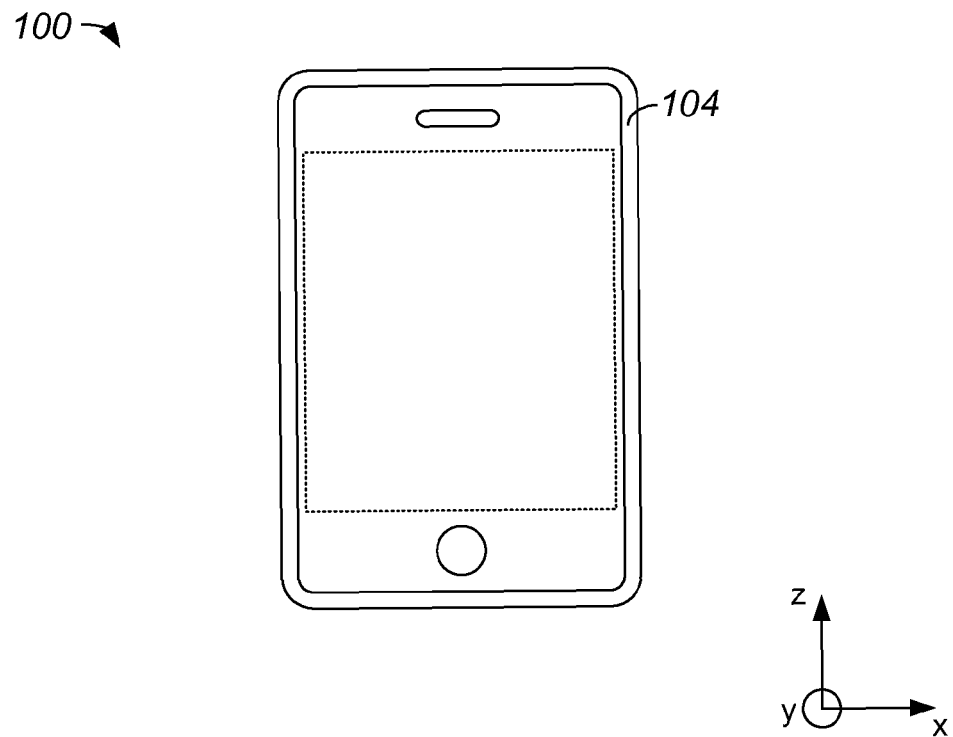
FIG. 1A is a diagrammatic front view representation of a device with a housing that is injection molded in accordance with an embodiment of the present invention.
Figure 1B:
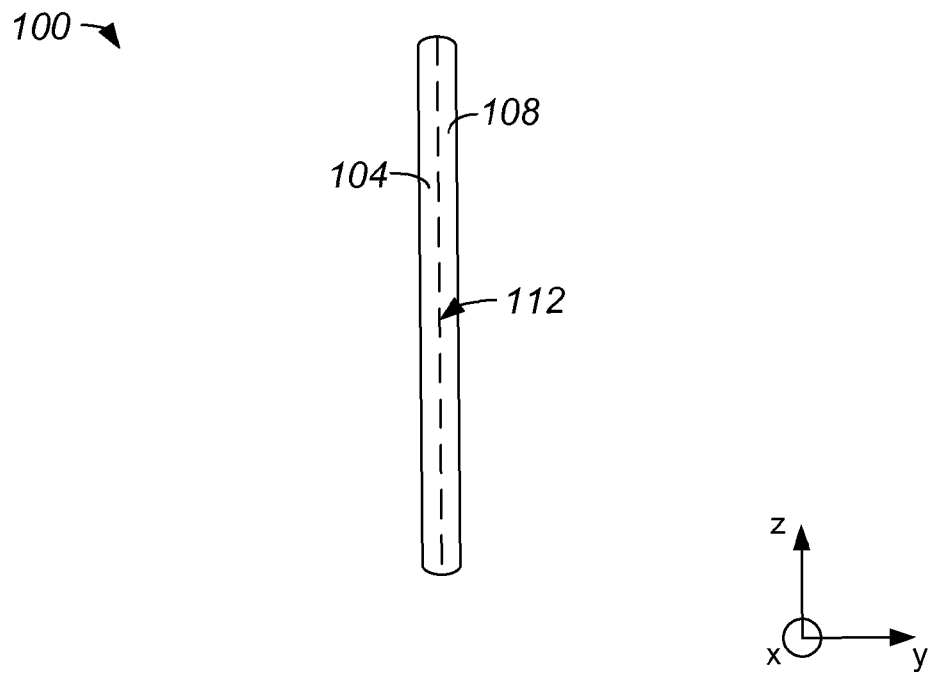
FIG. 1B is a diagrammatic side view representation of a device with a housing that is injection molded, e.g., device 100 of FIG. 1A, in accordance with an embodiment of the present invention.
Figure 1C:
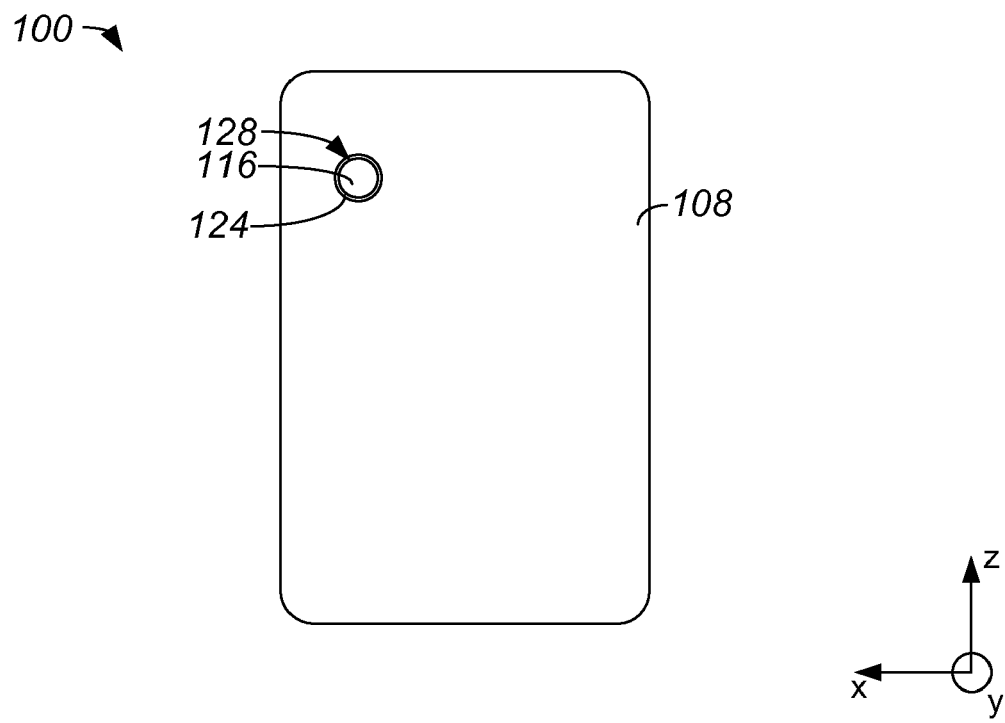
FIG. 1C is a diagrammatic back view representation of a device with a housing that is injection molded, e.g., device 100 of FIG. 1A, in accordance with an embodiment of the present invention.

Referring initially to FIGS. 1A-C, a device which includes a housing that is formed from different materials and includes a substantially gap-free, e.g., seamless or offset-free, overall external surface will be described in accordance with an embodiment of the present invention. FIG. 1A is a diagrammatic front view representation of a device with a housing that is injection molded in accordance with an embodiment of the present invention. A device 100 may be an electronic device such as a portable electronic device (e.g., mobile phone, digital media player device, handheld computing device or handheld electronic device. In one embodiment, device 100 may be the iPhone™ or the iPod Touch™ available from Apple Inc. of Cupertino, Calif. However, it should be appreciated that device 100 may generally be any electronic device, namely, consumer electronic devices.

Device 100 includes a first housing component 104. First housing component 104 may be a bezel formed from a metallic material. First housing component 104 is integrally bonded to a second housing component 108, as shown in FIG. 1B. Second housing component 108 is typically formed from a different material than used to form first housing component 104. By way of example, first housing component 104 may be formed from a metallic material while second housing component 108 may be formed from a plastic material. First housing component 104 and second housing component 108 are directly bonded together such that first housing component 104 and second housing component 108 are in direct contact at an interface 112 or "seam". In the described embodiment, first housing component 104 and second housing component 108 are bonded directly together at interface 112 through the use of a molding process that allows first housing component 104 and second housing component 108 to be held together without the use of adhesives and/or mechanical fasteners, e.g., screws. Further, the external surface of device 100 that is formed by first housing component 104 and second housing component 108 is tactilely seamless, e.g., there is no gap or offset. That is, first housing component 104 and second housing component 108, when directly bonded at interface 112, form a smooth, gap-free overall surface that encompasses interface 112. Although an edge or a seam associated with interface 112 may be seen, it should be appreciated that the edge associated with interface 112 may generally not be readily identified by touch, as there is no gap or offset associated with interface 112.

FIG. 1C is a diagrammatic representation of a back of device 100 in accordance with an embodiment of the present invention. As previously described, second housing component 108 may be formed from a plastic material. Device 100 may be arranged to include camera functionality and, hence, may include a lens component 116 that is formed from glass. It should be appreciated, however, that lens component 116 is not limited to being formed from glass and may, instead, be formed from any suitable, relatively transparent material.

Lens component 116 may be integrally bonded to a trim ring 124 such that a surface of lens component 116 and a surface of trim ring 124 form an overall smooth, gap-free surface. In the described embodiment, lens component 116 and trim ring 124 are directly bonded together at an interface 128. The overall assembly formed from lens component 116 and trim ring 124 may be inserted in, or otherwise supported by, second component 108.

In general, an injection molding process may be used to directly bond or to integrally bond one material to another such that an overall surface, e.g., an external or otherwise exposed surface, is substantially tactilely seamless or gap-free. That is, an injection molding process may be used to enable a single overall part to be formed from two different materials such that the two different materials form a cosmetic surface that is relatively smooth or level. The bond between the two different materials, which are materials of different types, may effectively allow a substantially seamless external surface of a housing to be formed.

Figure 2A:
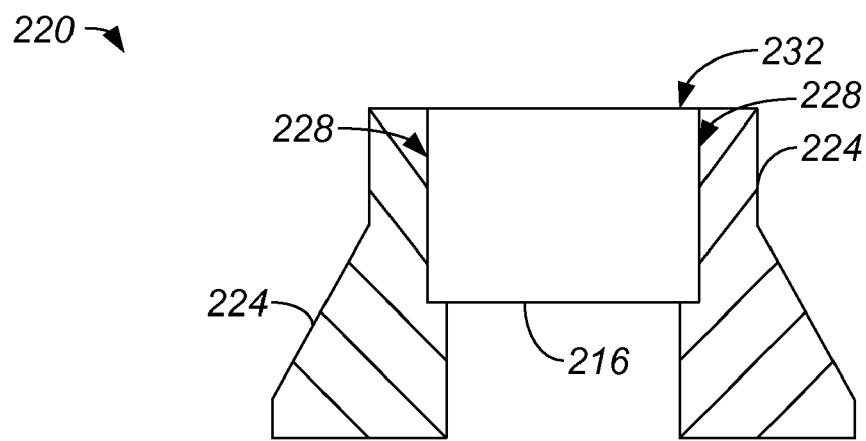
FIG. 2A is a diagrammatic cross-sectional side-view representation of an assembly that includes a glass piece to which a plastic piece is integrally bonded in accordance with an embodiment of the present invention.

Glass is one example of a material to which a different type of material may be directly bonded to create a gap-free external surface. For instance, plastic may be bonded to a glass piece to create an assembly with a smooth, external surface that may then be inserted in, or otherwise captured by, a housing. FIG. 2A is a diagrammatic side-view cross-sectional representation of an assembly with an external surface formed from glass and plastic which includes a cosmetic, gap-free external surface in accordance with an embodiment of the present invention. An assembly 220 includes a glass piece 216 and a trim ring 224 which is integrally or directly molded to a surface of glass piece 216. In one embodiment, trim ring 224 is formed from plastic, and is bonded to glass piece 216 during an injection molding process. Trim ring 224 is directly bonded to glass piece 216 such that an interface 228 is formed. Interface 228 is effectively formed between a bonding surface of glass piece 216 and a bonding surface of trim ring 224. Hence, interface 228 is associated with a direct bond between glass piece 216 and the material from which trim ring 224 is formed, and does not include any other materials, e.g., adhesives.

As trim ring 224 is directly bonded to glass piece 216, an overall external surface 232 of assembly 220 is smooth such that there is effectively no gap or offset associated with interface 228. Although overall external surface 232 is shown as being substantially planar and smooth, it should be appreciated that overall external surface 232 is not limited to being planar and smooth. By way of example, overall external surface 232 may instead be curved and smooth. In the described embodiment, a slope associated with overall external surface 232 is substantially continuous across an edge of interface 228.

Figure 2B:
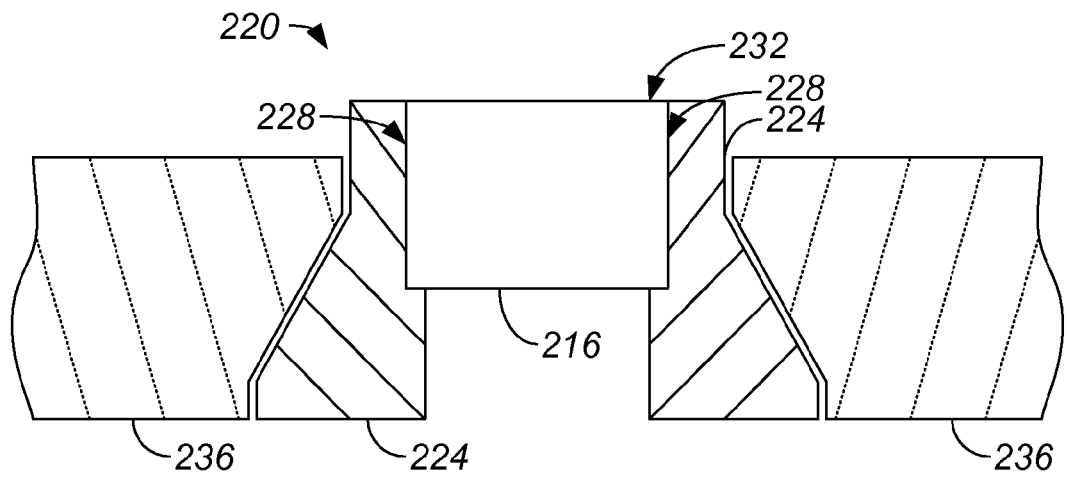
FIG. 2B is a diagrammatic cross-sectional side-view representation of an assembly that includes a glass piece to which a plastic piece is integrally bonded, e.g., assembly 220 of FIG. 2A, assembled into a housing in accordance with an embodiment of the present invention.
Figure 2C:
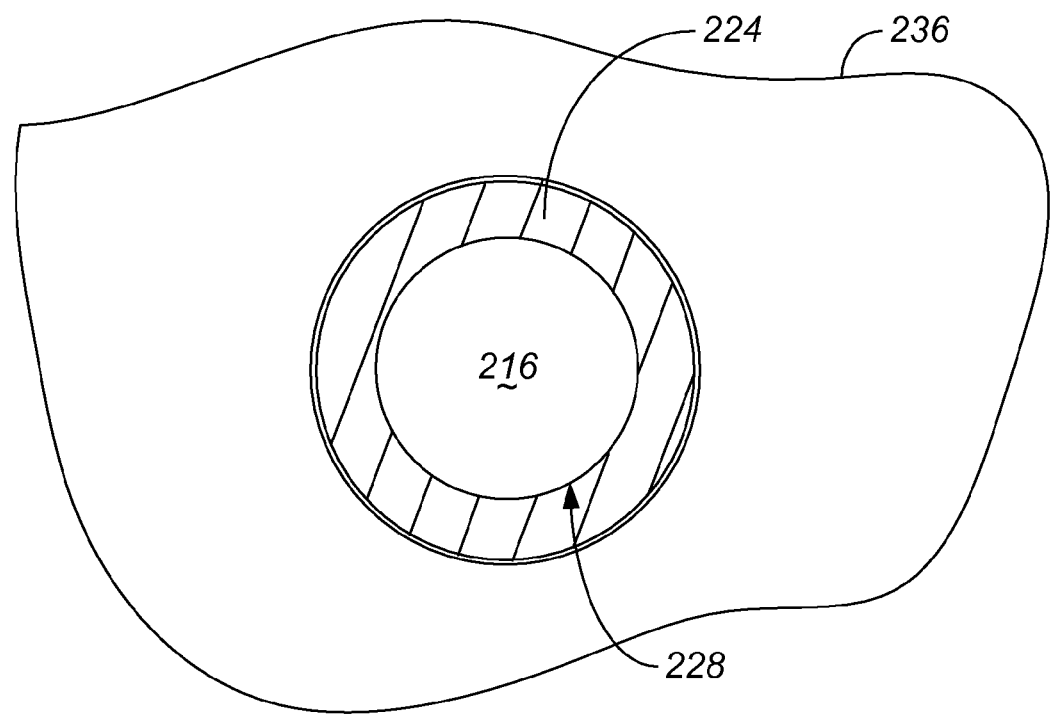
FIG. 2C is a diagrammatic top-view representation of an assembly that includes a glass piece to which a plastic piece is integrally bonded, e.g., assembly 220 of FIG. 2A, assembled into a housing, e.g., housing 236 of FIG. 2B, in accordance with an embodiment of the present invention.

Trim ring 224 may be configured to be captured in an overall housing, as shown in FIGS. 2B and 2C. Hence, assembly 220 is effectively arranged to facilitate the insertion of glass piece 216 into an overall housing 236 by allowing trim ring 224 to be captured by housing 236. That is, as glass piece 216 may be difficult to capture directly in housing 236, the creation of assembly 220 effectively enables glass piece 216 to be held within housing 236. In one embodiment, glass piece 216 may be associated with a camera lens, and housing 236 may be a housing of an electronic device that includes camera capabilities.

Figure 3:
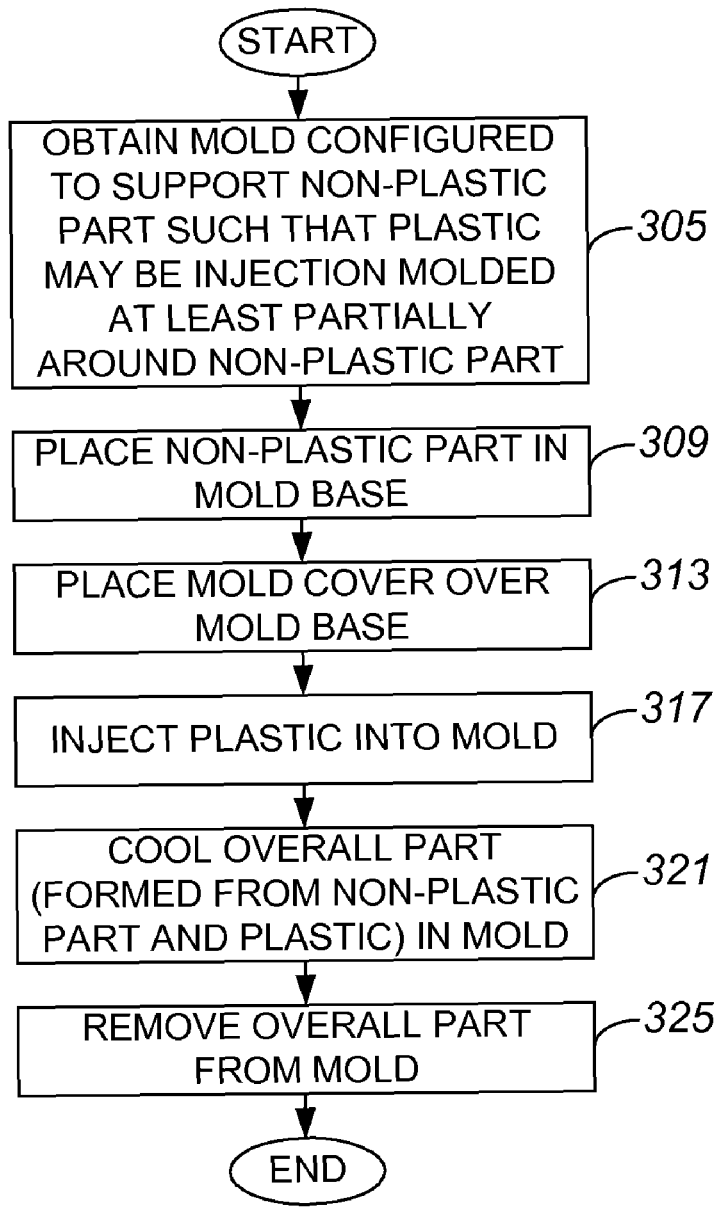
FIG. 3 is a process flow diagram which illustrates one method of injection molding plastic at least partially around a non-plastic part such that an overall part with a gapless surface is formed in accordance with an embodiment of the present invention.

With reference to FIG. 3, one process of injection molding plastic at least partially around a non-plastic part to such that an overall part with a gap-free or gapless surface is formed will be described in accordance with an embodiment of the present invention. A process 301 of creating an injection molded part begins at step 305 in which a mold is obtained. The mold, i.e., a mold that may be used in an injection molding process, may be configured to support a non-plastic part such that plastic may be injection molded at least partially around the non-plastic part. The mold may include structures that are arranged to support the non-plastic part such that the non-plastic part may remain stationary during an injection molding process. In other words, the mold may be configured to provide that at least one surface, e.g., a surface that is intended to be an external or exposed surface of a part formed using the mold, of a molded part may be formed such that the molded part is tactilely seamless.

After the mold is obtained, a non-plastic part that is to be molded around is placed in a base of the mold in step 309. The non-plastic part may be formed from substantially any material that is not predominantly plastic. By way of example, the non-plastic part may be a metal part such as a metal bezel or a glass part such as a glass window. In general, the non-plastic part is substantially solid, or not in a substantially liquid form. The non-plastic part may include features, such as openings or structures, that facilitate the bonding of injection molded plastic to the non-plastic part.

Once the non-plastic part is placed in the base of the mold, the mold is covered in step 313. Then, in step 317, plastic is injected into the mold. That is, molten plastic or otherwise non-solid plastic is injected into the mold. The molten plastic will typically at least partially surround the non-plastic part, and fill any openings, e.g., voids, in the non-plastic part that are intended to be filled by molten plastic. In general, the molten plastic comes into direct contact with a bonding surface of the non-plastic part.

In step 321, the overall part formed from the non-plastic part and the plastic injected into the mold in step 317 is allowed to cool or otherwise set in the mold. While the overall part cools, the molten plastic that is in direct contact with the bonding surface of the non-plastic part typically hardens to effectively form a bonding surface of the plastic. The bonding interface between the non-plastic part and the plastic is formed from a substantially direct bond between the non-plastic part and the bonding surface of the plastic. The bonding interface is such that an external surface of the overall part that is effectively divided by an edge of the bonding interface is substantially smooth and tactilely seamless, e.g., gap-free. That is, while an edge of the bonding interface may be visible as a border in the external surface that delineates a boundary between the non-plastic part and the plastic, as shown for example in FIG. 1B, the border is effectively tactilely non-existent. A tactilely non-existent border is a border that is essentially seamless and may effectively be difficult to physically feel, as there is no appreciable gap or offset associated with the border. After the overall part is cooled, the overall part may be removed from the mold in step 325. Upon removing the overall part from the mold, the process of creating an injection molded part is completed.

Figure 4A:
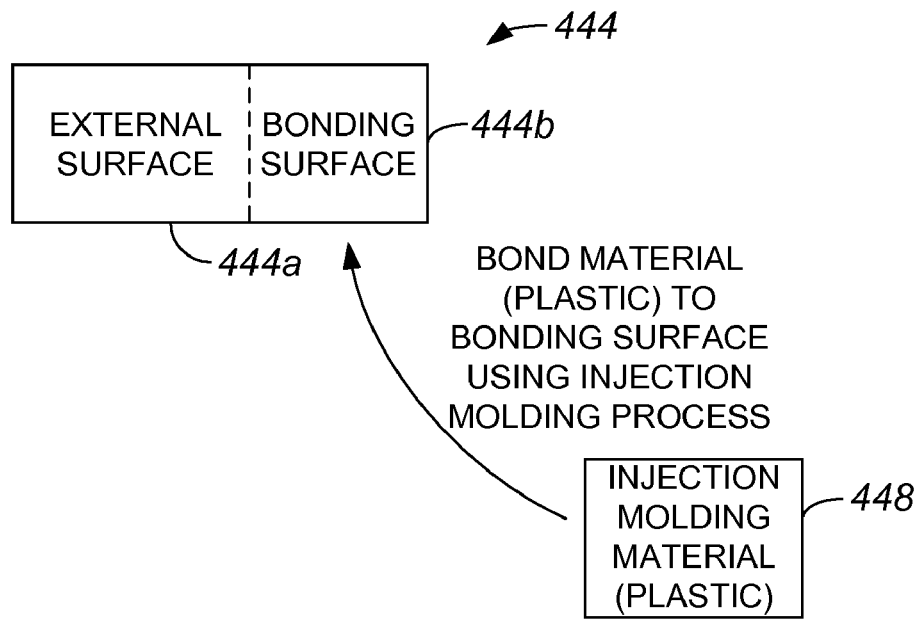
FIG. 4A is a block diagram representation of a non-plastic part prior to an injection molding process during which a material such as plastic is bonded to the non-plastic part in accordance with an embodiment of the present invention.

As previously mentioned, a non-plastic part that plastic is to be molded to such that a housing is created may include a bonding surface and an external surface. The plastic may be directly bonded to the bonding surface using an injection molding process. FIG. 4A is a block diagram representation of a non-plastic part prior to an injection molding process during which a material, e.g., plastic, is bonded to the non-plastic part in accordance with an embodiment of the present invention. A non-plastic part 444 includes an external surface 444a and a bonding surface 444b. External surface 444a is arranged, in one embodiment, to be an external surface of a housing or an exterior surface of an object. External surface 444a may be one side of non-plastic part 444, while bonding surface 444b may be an adjacent side of non-plastic part 444, i.e., bonding surface 444b may share an edge with external surface 444a. Non-plastic part 444 may be formed from a variety of different materials including, but not limited to including, metal and glass.

A material 448 that is suitable for injection molding, e.g., a plastic, is brought into contact with bonding surface 444b such that material 448 may bond directly with bonding surface 444b. That is, an injection molding process may be used to cause material 448 to bond directly to bonding surface 444a.

Figure 4B:
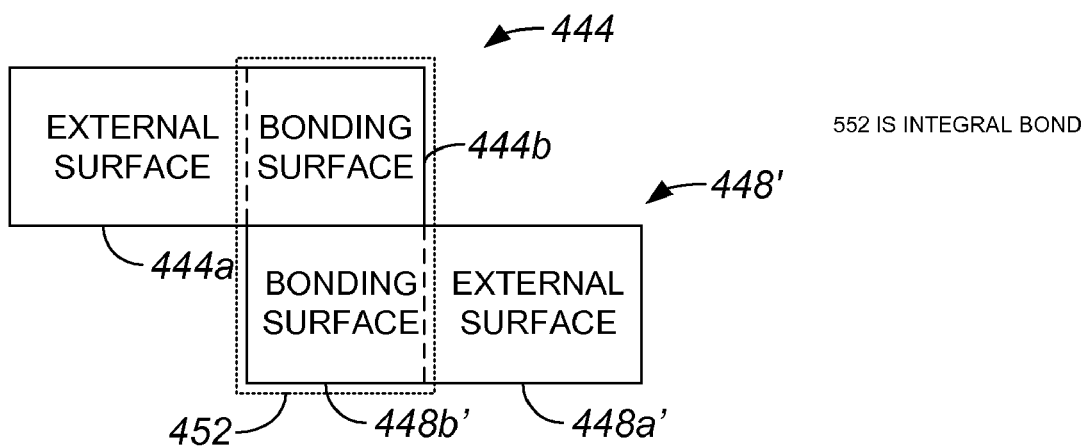
FIG. 4B is a block diagram representation of an overall part in which bonding surfaces of a plastic part and a non-plastic part, e.g., non-plastic part 444 of FIG. 4A, are bonded together through an injection molding process in accordance with an embodiment of the present invention.

Once an injection molding process occurs, material 448 may be directly bonded or molded to bonding surface 444a. As shown in FIG. 4B, once material 448 cools and, hence, hardens, material 448' may include a bonding surface 448b' and an external surface 448a'. Bonding surface 444a and bonding surface 448b' are bonded directly, or integrally attached, such that an interface 452 is formed between non-plastic part 444 and plastic part 448'. Typically, interface 452 does not include any external material, e.g., adhesive material. Bonding surface 444a and bonding surface 448b' are generally directly bonded such that they are attached to each other substantially without the need for fastening mechanisms or adhesive material.

Figure 4C:
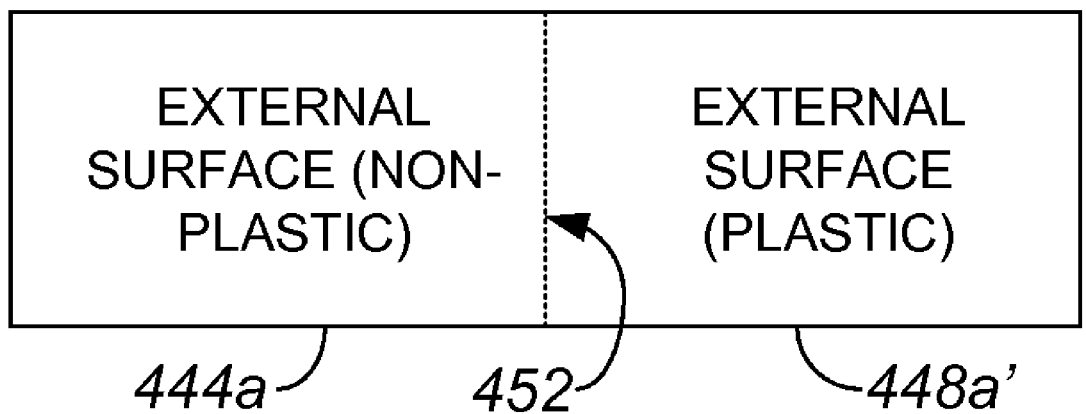
FIG. 4C is a block diagram representation of an overall part with a smooth, gapless external surface formed from a plastic part and a non-plastic part, e.g., plastic part 448' and non-plastic part 444 of FIG. 4B, in accordance with an embodiment of the present invention.

FIG. 4C is a block diagram representation of an overall part with a smooth, gapless external surface formed from plastic part 448' and non-plastic part 444 of FIG. 4B in accordance with an embodiment of the present invention. An edge of interface 452 is present in an overall external surface that includes external surface 444*a* and external surface 448*a'*. The edge of interface 452 smoothly or seamlessly blends into the overall external surface such that while the edge of interface 452 may be visible, the edge of interface 452 is not associated with any gaps or other non-smooth features, e.g., protrusions, that may be relatively easy to tactilely sense or physically feel.

Although only a few embodiments of the present invention have been described, it should be understood that the present invention may be embodied in many other specific forms without departing from the spirit or the scope of the present invention. By way of example, a smooth, gapless external surface may be an external surface on which an edge of an interface between parts formed from different materials is essentially not identifiable by touch. The overall external surface may, however, be textured. In other words, a smooth, gapless external surface is generally a surface on which an edge of an interface between parts may be visually identifiable, but may not be readily distinguishable in a tactile sense. While an edge of an interface between parts may not be readily distinguishable in a tactile sense, it should be appreciated that in some instances, the edge of an interface between parts may, while not including a gap or an offset, be identified by touch.

While a non-plastic part is often a part that includes no plastic, a non-plastic part is not limited to being a part that includes no plastic. A non-plastic part may be, in one embodiment, any part that is not predominantly plastic, or any part that is not substantially all plastic. In other words, a non-plastic part may be a part that includes substantially no plastic or a part that includes some plastic but is not primarily plastic.

The bonding surface of a non-plastic part may be substantially smooth such that plastic that is provided during an injection molded process may effectively form a substantially smooth bonding surface that directly bonds to the bonding surface of the non-plastic part such that a bonding interface is formed. Alternatively, the bonding surface of a non-plastic part may include features, e.g., voids or protrusions, that effectively allow the plastic to "grab on" to form a bonding interface. If the bonding surface of the non-plastic part includes features, the bonding interface is essentially formed between the surfaces of the features and the plastic.

The operations associated with the various methods of the present invention may vary widely. By way of example, steps may be added, removed, altered, combined, and reordered without departing from the spirit or the scope of the present invention.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A housing comprising:
    a first part, the first part being formed from a first material, the first part including a first external surface and a first bonding surface; and
    a second part, the second part being formed from a second material, the second material being a different type of material than the first material, the second part including:
        a second external surface formed by hardening the second material, the second material being a non-solid material; and
        a second bonding surface, the second bonding surface being integrally bonded to the first bonding surface, wherein the first external surface and the second external surface form a gap-free overall surface.

2. The housing of claim 1 wherein the first material is a non-plastic material and the second material is a plastic material.

3. The housing of claim 1 further comprising a third part being arranged to be inserted in the first part or second part, the third part further comprising:
    a first component formed from glass, the first component having a first exposed surface and a first bonding edge; and
    a second component, the second component is a non-glass material having a second exposed surface and a second bonding edge,
    wherein the second bonding edge being integrally bonded to the first bonding edge, and wherein the first exposed surface and the second exposed surface form a gap-free overall surface.

4. The housing of claim 3 wherein the first component is a lens and the second component is a trim ring.

5. The housing of claim 1 wherein the second bonding surface is integrally bonded to the first bonding surface using an injection molding process.

6. An apparatus comprising:
    at least one electrical component;
    a housing, the housing being arranged at least partially around the at least one electrical component, the housing including a first housing portion and a second housing portion, wherein the first housing portion is formed from a first material and includes a first external surface and a first bonding surface, and wherein the second housing portion is formed from a second material and includes a second external surface and a second bonding surface, the second material being a different type of material than the first material, the second bonding surface being integrally bonded to the first bonding surface such that the first external surface and the second external surface form a gap-free overall external surface, wherein the first housing portion and the second housing portion form a housing component; and
    a third housing portion, the third housing portion being arranged to be inserted in the housing component, the third housing portion having a first component formed from glass, the first component having a first exposed surface and a first bonding edge; and a second component, the second component is a non-glass material having a second exposed surface and a second bonding edge, wherein the second bonding edge being bonded to the first bonding edge, and wherein the first exposed surface and the second exposed surface form a gap-free exposed surface.

7. The apparatus of claim 6 wherein the second material is a plastic material and the first material is a non-plastic material.

8. The apparatus of claim 7 wherein the first material is metal.

9. The apparatus of claim 7 wherein the first material is glass.

10. The apparatus of claim 6 wherein the first component is a lens and the second component is a trim ring.

11. The apparatus of claim 6 wherein the apparatus is a handheld electronic device.

12. The apparatus of claim 11 wherein the handheld electronic device comprises a mobile phone.

13. The apparatus of claim 6 wherein the second bonding surface is integrally bonded to the first bonding surface using an injection molding process.

14. The apparatus of claim 6 wherein the first housing portion is a bezel.

15. A method of fabricating a housing, the method comprising:
   obtaining a first part, the first part being formed from a first material, the first part including a first external surface and a first bonding surface, and
   directly bonding a second part to the first bonding surface of the first part, the second part being formed from a second material, the second material provided in a non-solid form and hardened into a solid form to create a second external surface,
   wherein directly bonding the second part to the first part creates an overall external surface of the housing from the first external surface and the second external surface of the second part, the overall external surface being gap-free.

16. The method of claim 15 wherein the directly bonding of the second part to the first bonding surface of the first part includes creating a bond interface between the second part and the first bonding surface, and wherein an edge of the bond interface is part of the overall external surface.

17. The method of claim 15 wherein the first material is metal and the second material is a plastic material.

18. The method of claim 15 further comprising a third part arranged within an internal surface of the housing.

19. The method of claim 15 further comprising a third part being arranged to be inserted in the first part or second part, the third part further comprising:
   a first component formed from glass, the first component having a first exposed surface and a first bonding edge; and
   a second component, the second component is a non-glass material having a second exposed surface and a second bonding edge,
   wherein the second bonding edge being bonded to the first bonding edge, and wherein the first exposed surface and the second exposed surface form a gap-free exposed surface.

20. The method of claim 18 wherein the third part is glass.

* * * * *